United States Patent [19]

Young et al.

[11] Patent Number: 5,735,795
[45] Date of Patent: Apr. 7, 1998

[54] MARKER FOR MAGNETIC RESONANCE IMAGING

[75] Inventors: Ian Robert Young, Wiltshire; Michael Burl, Twickenham, both of United Kingdom

[73] Assignee: Picker International, Inc., Cleveland, Ohio

[21] Appl. No.: 683,719

[22] Filed: Jul. 18, 1996

[30] Foreign Application Priority Data

Jul. 20, 1995 [GB] United Kingdom ............... 9514877

[51] Int. Cl.$^6$ .................................................. A61B 5/055
[52] U.S. Cl. ...................... 600/410; 324/307; 324/309; 600/420
[58] Field of Search ........................ 324/307, 309; 128/653.2, 653.4, 899

[56] References Cited

U.S. PATENT DOCUMENTS

| | | |
|---|---|---|
| 4,916,170 | 4/1990 | Nambu . |
| 4,989,608 | 2/1991 | Ratner . |
| 5,148,109 | 9/1992 | Takane et al. . |
| 5,154,179 | 10/1992 | Ratner . |
| 5,211,166 | 5/1993 | Sepponen . |
| 5,218,964 | 6/1993 | Sepponen . |
| 5,271,400 | 12/1993 | Dumoulin et al. . |
| 5,303,707 | 4/1994 | Young . |
| 5,437,277 | 8/1995 | Dumoulin et al. . |
| 5,456,718 | 10/1995 | Szymaitis . |

FOREIGN PATENT DOCUMENTS

| | | |
|---|---|---|
| 4067845 | 3/1992 | Japan . |
| 5277088 | 10/1993 | Japan . |
| 5293094 | 11/1993 | Japan . |
| 9417733 | 8/1994 | WIPO . |
| 9614023 | 5/1996 | WIPO . |

*Primary Examiner*—Marvin M. Lateef
*Assistant Examiner*—Shawna J. Shaw
*Attorney, Agent, or Firm*—Timothy B. Gurin; John J. Fry

[57] ABSTRACT

A marker and probe for use in magnetic resonance imaging includes a vial for insertion within the body. The vial contains a material having a spin-lattice relaxation time less than that of the material of the body in a region being imaged. A coil arrangement having at least one coil tuned to the frequency of the magnetic resonance excited in the material during an excitation sequence is wound around the vial. The body is subjected to an T1 weighted examination sequence. The coil arrangement preferably has at least one turn which lies in a plane orthogonal to at least one other turn. Materials suitable for use in the vial include copper sulphate, iron chloride, or gadoliuium cholate. The vial consists of a material which does not exhibit a nuclear magnetic resonance spectrum.

21 Claims, 2 Drawing Sheets

1

MARKER FOR MAGNETIC RESONANCE IMAGING

BACKGROUND OF THE INVENTION

This invention relates to magnetic resonance methods and apparatus.

More particularly the invention relates to magnetic resonance methods and apparatus for the examination of an internal region of a body, for example, an internal region of the body of a live human patient for medical purposes.

In use of such magnetic methods and apparatus for examining the body of a line human patent for medical purposes, e.g. to obtain image and/or spectroscopic data, the body under investigation is placed in a homogeneous static magnetic field to define an equilibrium axis of magnetic alignment in the region of the body being examined. A radio frequency (r.f.) magnetic field is then applied to the region being examined in a direction orthogonal to the staic magnetic field direction to excite magnetic resonance in material, typically in hydrogen protons, in the region, and the resulting r.f. signals are detected and analysed. During this sequence of operations one or more gradients are normally imposed on the static magnetic field to cause excitation of magnetic resonance preferentially in the region of the body to be examined, to encode spatially the detected r.f. signals, and also for other purposes such as flow encoding.

It is sometimes required to provide in an image obtained an indication of a particular location in the body. In the case of a human patient the location may, for example, be the location of a catheter, surgical tool or other probe positioned inside the patient's body for carrying out an operation on the patient, or the location of a reference marker, i.e. a fiducial marker, attached to a patient to assist a surgeon in locating in the image a particular region of the patient's body.

In order to provide such an indication it has been proposed to position a coil at the location which can be supplied with electric current from a source outside the body so as to disturb locally the magnetic field applied for imaging and thereby produce an indication of the location in the image produced by the apparatus.

Alternatively a coil positioned at the location is used to apply an r.f. field to the body locally thereby to excite magnetic resonance in the body locally, adjacent the location, and the resulting spins are spatially encoded by the application of magnetic field gradients and detected.

Both these methods have the disadvantage that electrical connections from inside to outside the body are required which can be a severe disadvantage even in the case of catheters where a cable to the catheter is provided, since the cable is required for other purposes.

It is an object of the present invention to provide magnetic resonance methods and apparatus whereby this disadvantage is overcome.

SUMMARY OF THE INVENTION

According to a first aspect of the present invention there is provided a method of indicating a location in a region of a body being examined using a magnetic resonance technique comprising: positioning at the location a vial containing a material which has a spin-lattice relaxation time T1 which is less than that of any material of the body in said region which it is desired to examine; subjecting said region to a T1 weighted magnetic resonance excitation and detection examination sequence so as to acquire a detected signal in which a component due to the material in the vial is relative large compared with any component due to said material of the body in said region, the sequence including at least one magnetic field gradient whereby the detected signals are spatially encoded; and utilising the detected signals to obtain an indication of the position of said vial, and hence of said location, in said region.

According to a second aspect of the present invention there is provided a magnetic resonance apparatus for the examination of an internal region of a body including means for indicating a location in said region comprising: a vial positioned at the location and containing a material which has a spin-lattice relaxation time T1 which is less than that of any material of the body in said region which it is desired to examine; and means for subjecting said region to a T1 weighted magnetic resonance excitation and detection examination sequence so as to acquire a detected signal in which the component due to the material in the vial is relatively large compared with any component due to said material of the body in said region, the sequence including the application of at least one spatially encoding magnetic field gradient to said region to enable determination of the position of vial in the body from the detected signal.

In methods and apparatus according to the invention the vial preferably has wound around it a coil arrangement tuned to the frequency of the magnetic resonance excited in the material in the vial. Preferably the coil arrangement has at least one turn which lies in a plane substantially orthogonal to the plane of at least one other turn of the coil arrangement.

BRIEF DESCRIPTION OF THE DRAWINGS

A magnetic resonance method and apparatus in accordance with the invention will now be described by way of example with reference to the accompanying drawings in which.

DESCRIPTION OF THE PREFERRED EMBODIMENTS

Figure 1:
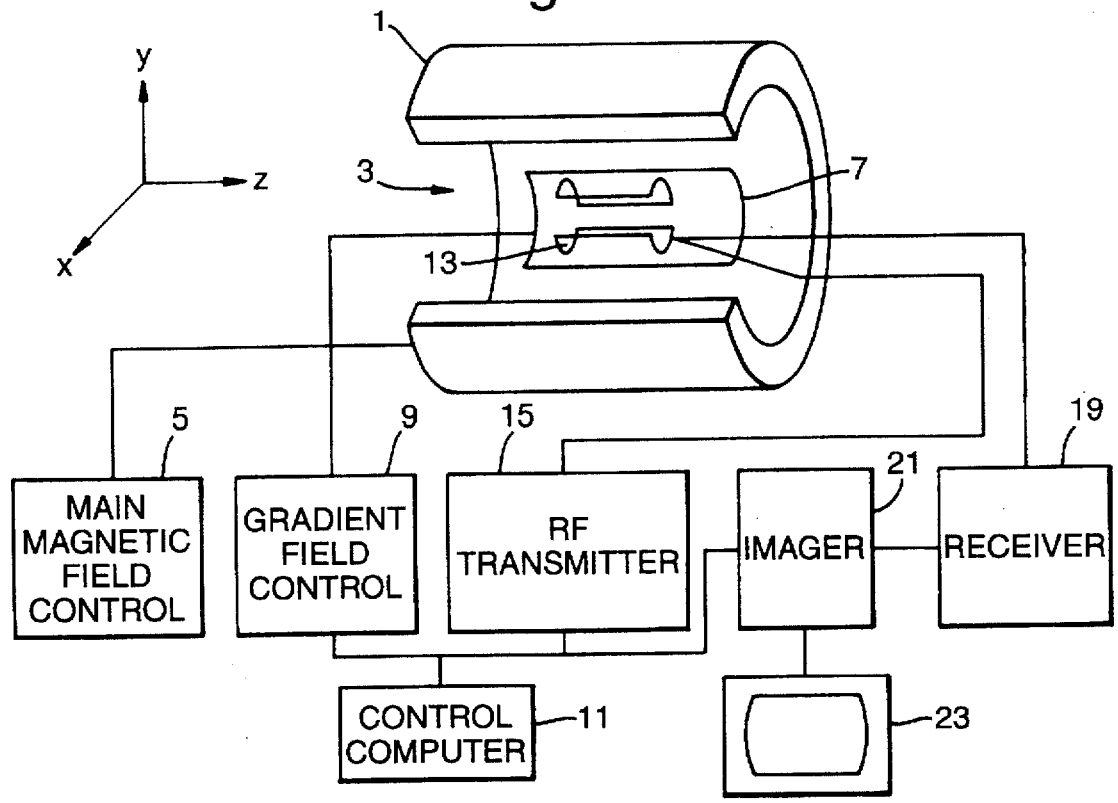
FIG. 1 is a schematic diagram of a typical magnetic resonance apparatus.

Referring to FIG. 1, the apparatus, which is a magnetic resonance medical imaging apparatus, includes a tubular electromagnet 1 which produces a strong uniform static main axial magnetic field in a cylindrical volume 3 in which a patient to be imaged is placed in use of the apparatus.

The strength of the field in the volume 3, and hence in the body of the patient being imaged, is controlled by a main magnet field control means 5 which controls the supply of energising current to the electromagnet energising coil (not shown).

The apparatus further includes a gradient coil arrangement 7 whereby a gradient may be imposed on the static magnetic field in the volume 3 in any one or more of three orthogonal directions. The coil arrangement 7 is energised by a gradient field control means 9 under control of a computer 11.

The apparatus further includes an r.f. coil system 13 which includes a transmitting coil arrangement which in operation of the apparatus is energised by an r.f. transmitter 15 under control of the computer 11 to apply an r.f. field to the body being imaged.

The r.f. coil system 13 also includes an r.f. receiving coil arrangement arranged to detect r.f. signals resulting from magnetic resonance excited in the body of the patient being imaged. The detected signals are passed via a receiver 19 to an imager 21 which under control of the computer 11 processes the signals to produce signals representing an image of the patient's body. These signals are, in turn, passed to a display device 23 to provide a visual display of the image.

In operation of the apparatus the strong magnetic field provided by the electromagnet 1 defines an equilibrium axis of magnetic alignment in the body being imaged.

To obtain an image of a selected region, e.g. a cross-sectional slice of the body, an r.f. field pulse is first applied to the body by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction i.e. into the x-y plane with x, y and z directions as depicted in FIG. 1. To restrict excitation to the selected region the r.f. field pulse is applied in conjunction with magnetic field gradients imposed by the coil arrangement 7, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. coil system 13, the processed to produce an image.

Normally a number of excitation and signal detection sequences are required to collect sufficient data to produce a satisfactory image.

Figure 2:
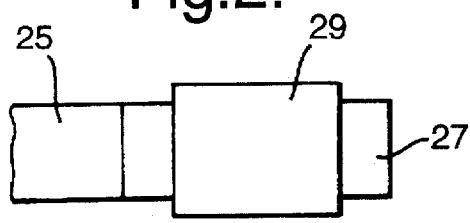
FIG. 2 is a diagram of a probe.

In accordance with the invention, if it is desired to provide in an image obtained an indication of a particular location in the patient's body a vial containing a material having a T1 value less than 0.5 times that of fat (the material in human tissue having the shortest T1 value), is positioned at the location. As illustrated in FIG. 2 where, for example, the location is the location of a probe 25 of cylindrical form, the vial 27 suitably constitutes a section of the probe 25, preferably an end section. The material in the vial 27 suitably comprises a liquid such as water doped with copper sulphate ($CuSO_4$) or iron chloride ($FeCl_3$) or a gadolinium cholate, e.g. Gd-DTPA. The vial 27 itself, of course, consists of material which does not exhibit a nuclear magnetic resonance spectrum and does not therefore generate r.f. signals during operation of the apparatus.

To locate the position of the probe 25 in the patient's body a T1 weighted excitation and detection sequence including spatially encoding magnetic field gradients of known form is used. A rapid scan with short recovery time (TR) may, for example, be used. By way of example, one suitable T1 weighted sequence comprises applying a first r.f. field pulse of sufficient intensity and duration to tip the spins of nuclei in the material in the vial 27 from the direction of the static magnetic field through 180°, followed after a short delay by a second r.f. field pulse which tips the spins through 90°, the amplitude of the detected signal then depending on the T1 value of the nuclei producing it.

The vial location excitation and detection sequence also includes spatial encoding magnet field gradients in appropriate directions, e.g. in x and y directions when an x-y slice of a patient's body is being imaged.

The detected signals produced by the vial location excitation and detection sequence thus comprise a readily identifiable component, i.e. a component which is much larger than any component due to the material of the body which may be present in the detected signals, whose frequency indicates the location of the vial 27 in the body.

It will be appreciated that the vial location sequence will normally be carried out separately from the imaging sequences. The data obtained from the vial location sequence is then used to superimpose an indication of the vial's position on the image produced using the data collected during the image sequences.

In order to enhance the attached signals produced by the material in the vial 27 a coil arrangement 29 tuned to magnetic resonance frequency of the material in the vial 27 is wound around the vial 27. The coil arrangement 29 provides local amplification of the exciting r.f. field so that, for example, the excitation angle of the material in the vial 27 can be made substantially greater than that of the material of the body, i.e. the vial can be more effectively excited than the material of the body. Typically an r.f. excitation pulse sufficient to tip spins in the material of the body as a whole by only 2° can be used to tip spins by 90° in the material in the vial. The coil arrangement 29 also collects the vial magnetisation very efficiently so that even if undercoupled to the receiver the detected vial signal is further enhanced.

Such enhancement of the signals produced by the vial reduces difficulties in location of the position of the probe 25 even in special circumstances. Examples of such special circumstances are when fresh spins enter an imaging region, e.g. due, for example, to inflow of previously unexcited blood, resulting in a high detected signal even if TR is very short and when a low static magnetic field is used so that the T1 values are small and approach T2 values.

Figure 3:
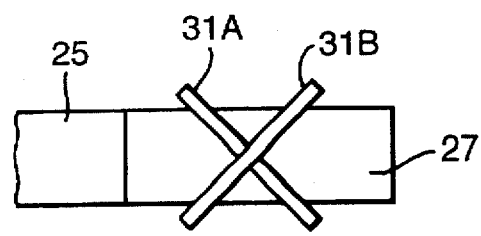
FIG. 3 is a diagram of the probe showing details of a coil arrangement of the probe.
Figure 4:
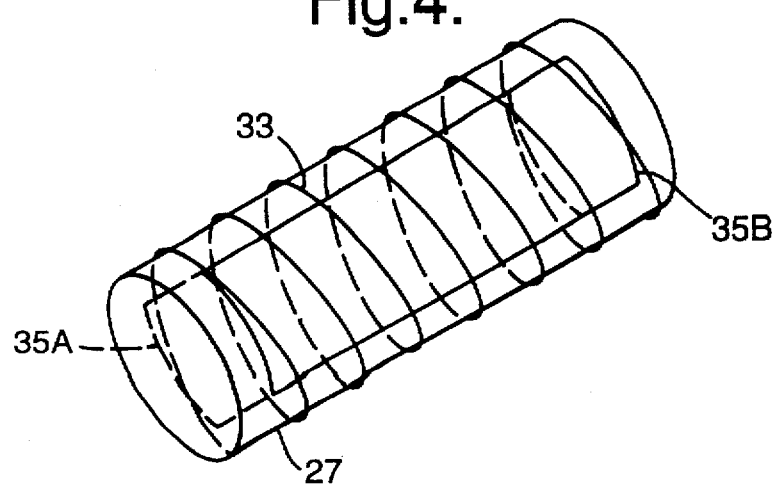
FIG. 4 illustrates an alternative form for the coil arrangement.

The coil arrangement 29 may comprise a single planar coil disposed coaxially around the vial 27 and connected with a tuning capacitor (not shown). However, in order to avoid reduction, or even loss, of signal produced by the material in the vial 27 when the plane of the coil is parallel to the r.f. flux direction the coil arrangement preferably includes two coils, each with its own tuning capacitor. As illustrated in FIG. 3 two planar coils 31A and 31B lying in orthogonal planes each at an angle of 45° to the axis of the vial 27 may be used. Alternatively a short solenoid coil 33 coaxial with the vial 27 with a pair of saddle coils 35A, 35B at diametrically opposite position on the vial 27 may be used, as illustrated in FIG. 4.

What is claimed is:

1. A method of indicating a location in a region of a body being examined using a magnetic resonance technique, the method comprising the steps of:

positioning a marker within the region, the marker comprising
        a first material having a desired relaxation time; and
        at least a first coil tuned to a desired frequency, said coil not having an external electrical connection;

subjecting the region to a magnetic resonance excitation and detection examination sequence so as to acquire a detected signal, the sequence including at least one magnetic field gradient whereby the detected signals are spatially encoded; and utilizing the detected signal to determine a location of the marker.

2. The method of claim 1 wherein the marker is affixed to a probe.

3. The method of claim 2 comprising the step of subjecting the region to a T1 weighted examination sequence and wherein the first material has a spin-lattice relaxation time less than the material of the body in the region.

4. A method of indicating a location in a region of a body being examined using a magnetic resonance technique, the method comprising the steps of:

positioning a marker within the region, the marker comprising at first material having a desired relaxation time; and at least a first coil tuned to the magnetic resonance frequency excited in the first material by the magnetic resonance technique;

subjecting the region to a magnetic resonance excitation and detection examination sequence so as to acquire a detected signal the sequence including at least one magnetic field gradient whereby the detected signals are spatially encoded; and utilizing the detected signal to obtain an indication of the location of the marker.

5. The method of claim 1 wherein the marker further comprises a vial, the first material being contained therein.

6. The method of claim 5 wherein the first coil comprises at least one turn wound around the vial.

7. The method of claim 1 wherein the marker comprises first and second coils which lie in substantially orthogonal planes.

8. The method of claim 1 wherein the marker comprises a solenoid coil and a pair of saddle coils positioned substantially in register on opposite sides of the axis of the solenoid coil.

9. A magnetic resonance apparatus for examining an internal region of a body, the apparatus comprising:

means for subjecting the region to a magnetic resonance excitation and detection examination sequence so as to acquire a detected signal, the sequence including the application of at least one spatially encoding magnetic field gradient to said region; and a marker for placement within the region, the marker comprising a first material having a desired relaxation time; and at least a first coil tuned to the resonant frequency excited in the first material; whereby the location of the marker may be determined.

10. The apparatus of claim 9 wherein the first material has a spin-lattice relaxation time less than the material of the body in the region and the examination sequence is a T1 weighted sequence.

11. The apparatus of claim 9 wherein the marker further comprises a vial, the first material being contained therein.

12. The apparatus of claim 11 wherein the first coil comprises at least one turn wound about the vial.

13. The apparatus of claim 9 wherein the marker comprises first and second coils which lie in substantially orthogonal planes.

14. The apparatus of claim 9, the marker comprising a coil arrangement having at least one turn which lies in a plane substantially orthogonal to at least one other turn.

15. The apparatus of claim 9 wherein the marker comprises a solenoid coil and a pair of saddle coils positioned in register on opposite sides of the axis of the solenoid coil.

16. A magnetic resonance apparatus for examining an internal region of a body, the apparatus comprising:

means for subjecting the region to a magnetic resonance excitation and detection examination sequence so as to acquire at detected signal, the sequence including the application of at least one spatially encoding magnetic field gradient to said region; and a marker for placement within the region, the marker comprising a first material comprising at least one of copper sulphate, ferric chloride, and gadolinium cholate, and having a desired relaxation time; and at least a first coil tuned to the resonant frequency excited in the first material;

whereby the location of the marker may be determined.

17. A magnetic resonance apparatus for examining an internal region of a body, the apparatus comprising:

means for subjecting the region to a T1 weighted magnetic resonance excitation and detection examination sequence so as to acquire a detected signal, the sequence including the application of at least one spatially encoding magnetic field gradient to said region;

a first material for positioning within the region, the first material having a spin-lattice relaxation time less than the material of the body in the region; and at least a first coil for positioning within the region, the coil being tuned to the frequency of the magnetic resonance excited in the first material;

the sequence being selected such that the component of the detected signal due to the first material is relatively large compared to the component due to the material of the body in the region, whereby the location of at least one of the first material and the coil may be determined.

18. The apparatus of claim 17 comprising a second coil tuned to a frequency other than the frequency of the magnetic resonance excited in the first material.

19. The apparatus of claim 17 further comprising a vial containing the first material, at least one coil being wound around the vial.

20. The apparatus of claim 17 comprising a coil arrangement having at least one turn which lies in a plane substantially orthogonal to at least one other turn.

21. A magnetic resonance apparatus for examining an internal region of a body, the apparatus comprising:

means for subjecting the region to a magnetic resonance excitation and detection examination sequence so as to acquire a detected signal, the sequence including the application of at least one spatially encoding magnetic field gradient to said region and the application of at least one r.f. field pulse for exciting magnetic resonance in said region; and a marker for placement within the region, the marker comprising a first material having a desired relaxation time; and coil means tuned to the magnetic resonance frequency of the first material for amplifying the r.f. field pulse in the region of the first material;

whereby the location of the marker may be determined.

* * * * *